(12) United States Patent
Brekelmans

(10) Patent No.: US 6,701,142 B1
(45) Date of Patent: Mar. 2, 2004

(54) MIXER OSCILLATOR STAGE

(75) Inventor: Johannes H. A. Brekelmans, Briarcliff Manor, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/328,252

(22) Filed: Jun. 8, 1999

(30) Foreign Application Priority Data

Jun. 10, 1998 (SG) .............................................. 9801387

(51) Int. Cl.[7] .................................................. H04B 1/26
(52) U.S. Cl. .......................... 455/315; 455/60; 455/209; 455/314
(58) Field of Search .......................... 455/60, 250, 260, 455/207, 209, 313, 314, 315, 323, 333

(56) References Cited

U.S. PATENT DOCUMENTS

| 3,955,200 | A | * | 5/1976 | Miller .......................... 342/14 |
| 4,157,505 | A | * | 6/1979 | Owens ........................ 325/470 |
| 4,704,735 | A | | 11/1987 | Swapp et al. .................. 455/68 |
| 5,574,997 | A | * | 11/1996 | Hong ....................... 455/180.1 |
| 5,881,369 | A | * | 3/1999 | Dean et al. ..................... 455/78 |
| 5,953,640 | A | * | 9/1999 | Meador et al. ................ 455/73 |
| 6,243,567 | B1 | * | 6/2001 | Saito ........................... 348/731 |

FOREIGN PATENT DOCUMENTS

| EP | 0667712 | A2 | 8/1995 | |
| EP | 0898365 | A1 | 2/1999 | ............. H03J/5/24 |

* cited by examiner

Primary Examiner—William Trost
Assistant Examiner—Danh Le

(57) ABSTRACT

A mixer oscillator stage, which can be used both with a switched 2-band concept and a 3-band concept without changing the architecture of the oscillators which exceeds the number of mixers and by coupling the mixer(s) and oscillators via a switching circuit so as to switch between the different oscillators in dependence upon the part of the band converging the signal.

7 Claims, 3 Drawing Sheets

MIXER OSCILLATOR STAGE

BACKGROUND OF THE INVENTION

1. Field of the Invention

The invention relates to a mixer oscillator stage. The invention further relates to a mixer oscillator integrated circuit and to a tuner. The invention also relates to a receiver, and more particularly, but not exclusively, a television receiver.

2. Description of the Related Art

Such a mixer oscillator stage is used in, for example, television receivers. Different solutions are known for such a mixer oscillator stage. As is known, television signals comprise signals in the bands historically referred to as UHF and VHF bands. In most cases, the VHF band is split into at least two ranges (VHFL and VHFH).

For 3-band tuners, the different bands are often referred to as A, B and C, or Low, Mid and High. For 2-band tuners, it is customary to refer to the bands as VHF-Low, VHF-High and UHF, although the UHF band may be capable of receiving frequencies transmitted below the UHF band.

The most straightforward solution is to use the 3-band concept with a separate mixer and oscillator for each band. The above solution is quite complex. To reduce the costs of three different bands, a switching between the low and high VHF signals is performed. The range switching is normally performed with a switching diode which selects a different coil inductance for VHF-Low and VHF-High. Especially, if the mixer oscillator stage is implemented as an integrated circuit which also has a PLL function, referred to as MO-PLL Combi IC, a 3-band tuner is not possible without exceeding the 28-pin structure that the 2-band switched version has. The 28-pin package is one of the largest cost-effective packages available today.

To reduce the number of necessary pins, it is proposed to pursue asymmetrical input/output functions. To achieve a good performance, a good isolation between the mixer/oscillator functions, like oscillators, mixers, and the IF amplifier, is necessary. It is hardly possible to achieve this good isolation by using asymmetrical input /output functions.

Balanced signal pairs and balanced circuitry have so far provided the best performance. The performance must meet the more stringent requirements recently imposed by the European CENELEC directive EN55020. EN55020 is a European directive on EMC requirements for television and sound broadcast receivers and associated equipment. Special attention must be paid during tuner design to ensure that the requirements are met.

One of the disadvantages of the known mixer oscillator stages (topologies) is that different mixer oscillator topologies are necessary for the 3-band concept and for the switched 2-band concept, making the development of at least two different topologies expensive and time-consuming. A further disadvantage is that the 3-band concept (especially MOPLL Combi) requires more input and oscillator pins necessary for the mixer oscillator integrated circuit.

SUMMARY OF THE INVENTION

It is object of the invention to overcome the disadvantages of the prior art and further to provide a mixer oscillator stage, a mixer oscillator integrated circuit, a tuner and a television receiver having an improved performance.

To this end, a first aspect of the invention provides a mixer oscillator stage comprising mixing means with at least one mixer, oscillator means with at least two oscillators and switching means coupled between the at least one mixer and the at least two oscillators, the number of oscillators exceeding the number of mixers A second aspect of the invention provides a mixer oscillator integrated circuit incorporating the above mixer oscillator stage A third aspect of the invention provides a tuner comprising the above mixer oscillator stage.

A fourth aspect of the invention provides a receiver comprising such a tuner.

By choosing number of oscillators to be larger than the number of mixers and by using switching means in between, the same mixer oscillator stage can be used for different applications. The cost of development are thereby largely decreased.

An embodiment of a mixer oscillator stage according to the invention has the features that the oscillator means comprises a first, a second and a third oscillator, the mixing means comprises a first and a second mixer, and the switching means are coupled between the mixers and the oscillators.

By using three oscillators and switching means, it is possible to use the same mixer oscillator stage for a 2-band switched concept and for a genuine 3-band concept.

BRIEF DESCRIPTION OF THE DRAWINGS

The invention and additional features which may optionally be used to implement the invention to advantage, will be apparent from and elucidated with reference to the examples described hereinafter and shown in the drawings. In these drawings.

Identical elements are denoted by the same reference numerals throughout the drawings.

DESCRIPTION OF THE PREFERRED EMBODIMENTS

Figure 1:
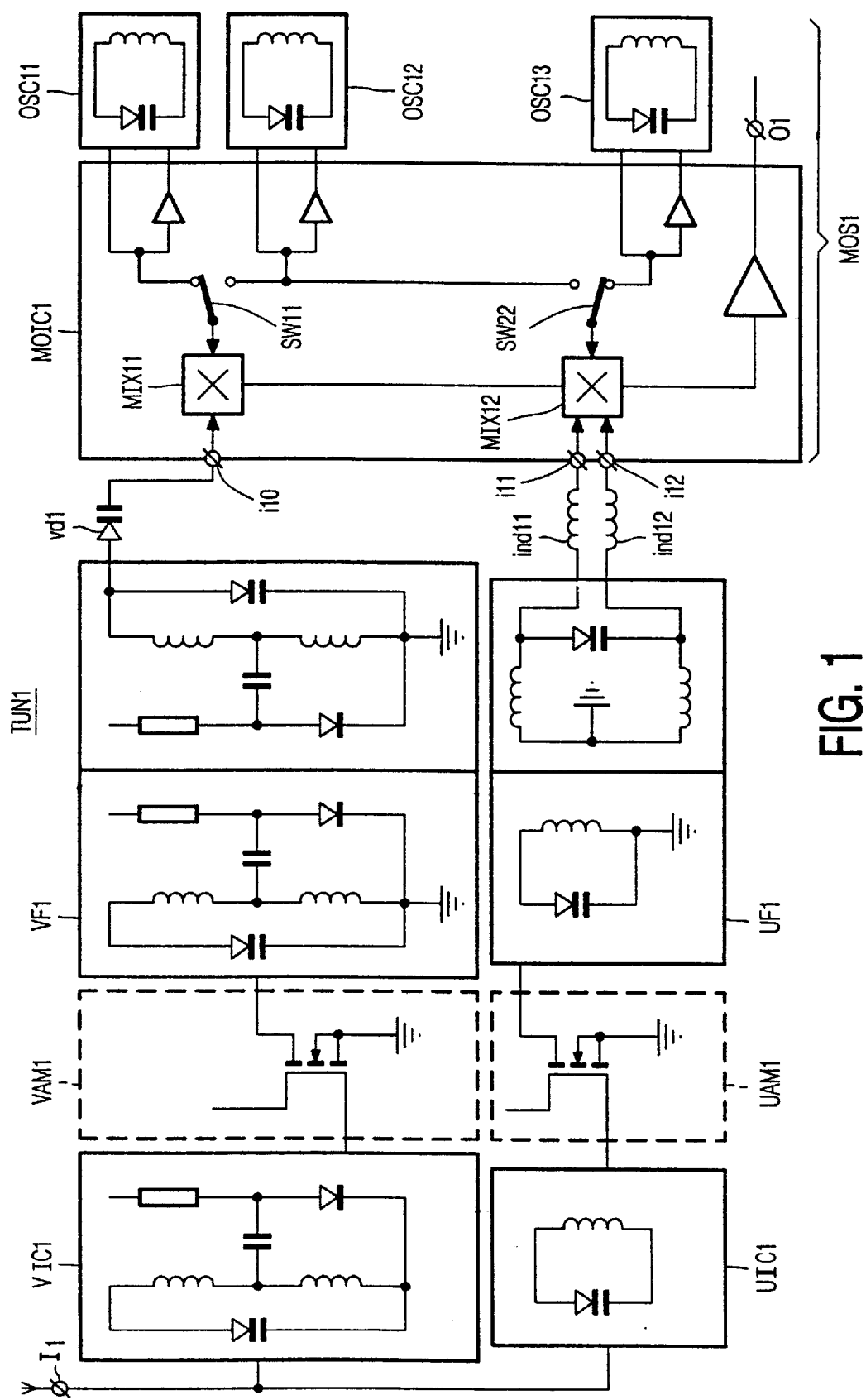
FIG. 1 shows a first embodiment of a tuner according to the inventions.

FIG. 1 shows a first embodiment of a tuner TUN1 according to the invention, having an input I1 for receiving an antenna signal. The input I1 is coupled to a VHF-tuned input circuit VIC1 and to a UHF-tuned input circuit UIC1.

The tuned input circuits VIC1 and UIC1 are coupled to amplifier stages VAM1 and UAM1, respectively. Each amplifier stage is coupled to a bandpass filter VF1 and UF1, respectively.

The bandpass filter VF1 is coupled, via a varicap diode vd1, to a first input i10 of a mixer oscillator integrated circuit MOIC1.

The bandpass filter UF1 is coupled via a first and a second inductance ind11 and ind12, to a second and a third input i11 and i12 of the mixer oscillator integrated circuit MOIC1.

The first input i10 is coupled to a first mixer MIX11 of the mixer oscillator integrated circuit, and the second and third inputs i11 and i12 are coupled to a second mixer MIX12 of the mixer oscillator integrated circuit.

The tuner TUN1 further comprises a first, a second and a third oscillator OSC11, OSC12 and OSC13, these oscillators are being a part of a mixer oscillator stage MOS1, and being coupled to one of the mixers MIX11 and MIX12 via first and second switching means SW11 and SW12, respectively.

The output of each mixer MIX11 and MIX12 is coupled to an output O1 of the tuner TUN1 for supplying an IF signal.

The mixer oscillator integrated circuit MOIC1 and the oscillators OSC11, OSC12 and OSC13 are part of the mixer oscillator stage.

This embodiment of the tuner TUN1 operates as follows.

After receiving the antenna signal at the input I1, the signal in this embodiment is split into a VHF band and a UHF band, in which the tuned input circuit VIC1, the amplifier stage VAM1 and the filter VF1 will handle the VHF signals (as is known to those skilled in the art). The tuned input circuit UIC1, the amplifier stage UAM1 and the filter UF1 will handle the UHF signals (as is also known to those skilled in the art).

In this embodiment, the filtered signals are supplied to the mixer oscillator integrated circuit MOIC1 at inputs i10, input i11 and i12, respectively. The VHF signals are supplied to the mixer MIX11, the other input of which receives, via the switching means SW11, a signal from either the first oscillator OSC11 or the second oscillator OSC12, depending on the part of the VHF band to which the required signal belongs to. After mixing, the mixer supplies the IF signal at the output O1.

Nowadays, UHF signals are handled symmetrically. The UHF filter UF1 supplies the UHF signal symmetrically via the inductances ind11 and ind12 to the mixer MIX12, the other input of which receives a signal from either the second oscillator OSC12 or the third oscillator OSC13, depending on the part of the UHF band the required signal belongs to.

In this way, the mixer oscillator stage can handle all the signals of a switched 2-band concept. Instead of an implementation as an integrated circuit, it is also possible to obtain a mixer oscillator stage with discrete components only.

Figure 2:
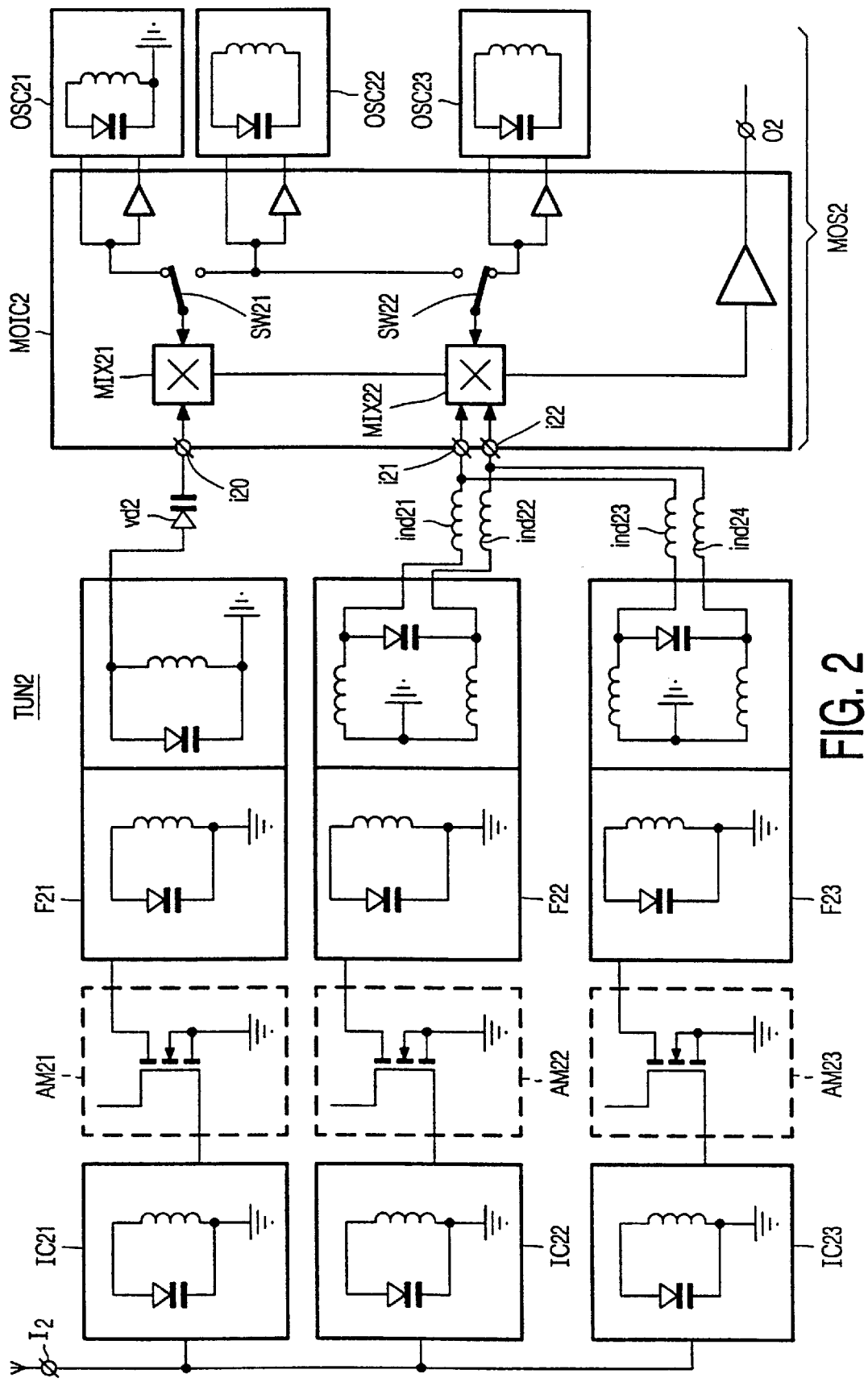
FIG. 2 shows a second embodiment of a tuner according to the invention.

FIG. 2 shows a second embodiment of a tuner TUN2 according to the invention, having an input I2 for receiving an antenna signal. The input is coupled to tuned input circuits IC21, IC22 and IC23, respectively.

Each tuned input circuit is coupled to an amplifying stage AM21, AM22 and AM23, respectively.

Each amplifying stage is coupled to a filter F21, F22 and F23, respectively.

The filter F21 is coupled, via a varicap diode vd2, to a first input i20 of a mixer oscillator integrated circuit MOIC2.

The filter F22 is coupled, via a first and a second inductance ind21, ind22 to a second and a third input i21, i22, respectively, of the mixer oscillator integrated circuit.

The filter F23 is coupled, via a third and a fourth inductance ind23 and ind24, to the second and the third input i21, i22 respectively, of the mixer oscillator integrated circuit.

The tuner TUN2 further comprises a first, a second and a third oscillator OSC21, OSC22 and OSC23, these oscillators being a part of a mixer oscillator stage MOS2, and being coupled to one of the mixers MIX21 and MIX22 via first and second switching means SW21 and SW22, respectively.

The output of each mixer MIX21, MIX22 is coupled to an output O2 of the tuner TUN2 for supplying an IF signal.

This embodiment of the tuner TUN2 operates as follows.

As will be noted in this embodiment of the tuner TUN2, this tuner is built up as a 3-band concept. Similarly as in FIG. 1, the mixer oscillator integrated circuit MOIC2 receives the different filtered signals at either input i20 or, as symmetrical signal, at the inputs i21 and i22.

Also in this embodiment, the mixer oscillator stage MOS2 comprises two mixers MIX21 and MIX22 and three oscillators OSC21, OSC22 and OSC23.

The relevant mixer MIX21 (MIX22) receives the filtered signal at one input (symmetrical input) and the signal from either oscillator OSC21 or OSC22 (OSC22 or OSC23) at the other input.

The mixer concerned supplies the obtained IF signal to the output of the tuner TUN2.

As is shown in relation to FIGS. 1 and 2, the same mixer oscillator stage MOS1, MOS2 can be used for the switched 2-band concept (FIG. 1) and the 3-band concept (FIG. 2).

As mentioned above, instead of an implementation as a mixer oscillator integrated circuit, it is also possible to implement the mixer oscillator stage with discrete components only.

Figure 3:
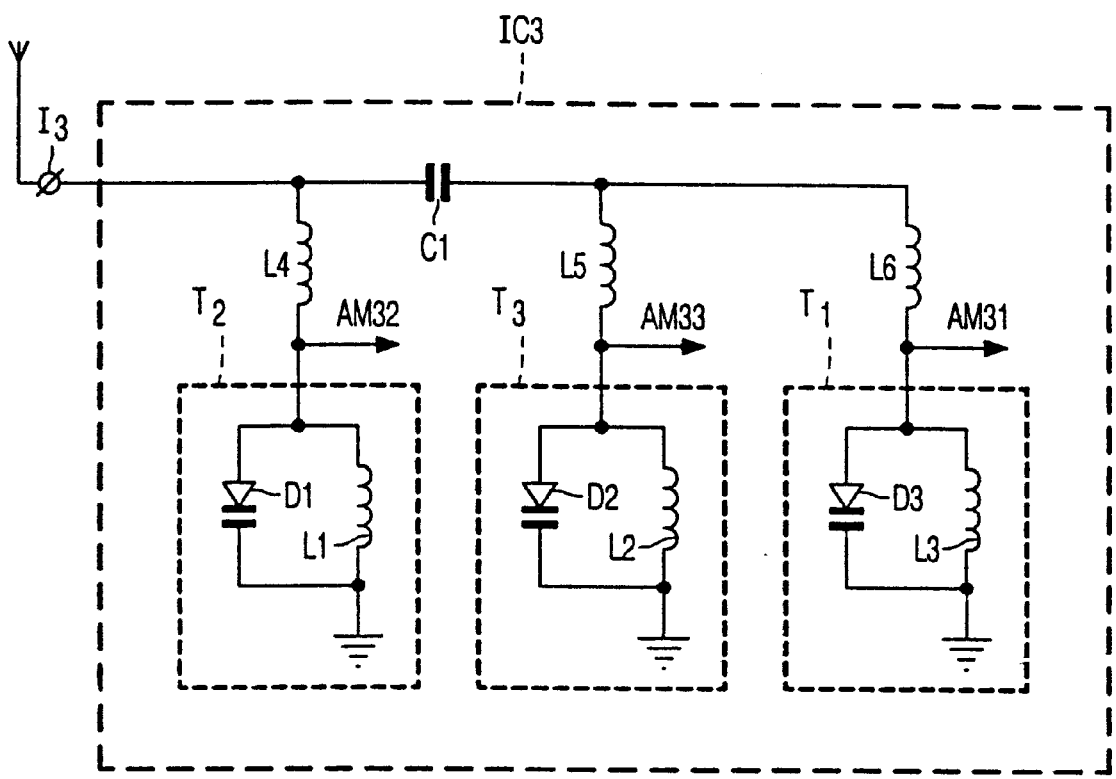
FIG. 3 shows an embodiment of an input circuit for use in a tuner according to the invention.

FIG. 3 shows an embodiment of filter means for use in a tuner according to the invention.

The input circuit IC3 receives an antenna signal at an input I3. A first tuned circuit T1, comprising diode D3 and inductance L3, is coupled to the input I3 via an inductance L6 and a capacitance C1. A second tuned circuit T2, comprising diode D1 and inductance L1, is coupled to the input I3 via inductance L4. A third tuned circuit T3, comprising diode D2 and inductance L2, is coupled to the input I3 via an inductance L5 and the capacitance C1. The inductances L4, L5 and L6 are coupling coils which perform an impedance transformation from the antenna impedance to the varying frequency-dependent impedance of the tuned circuits T1, T2 and T3.

For signals intended for tuned circuit T1, the filter can be considered as a high-pass filter comprising L4+L1, C1 and L5+L2.

This input circuit has been described extensively in the U.S. Pat. No. 4,851,796 which patent is herein incorporated by reference.

In the above description, the idea of the invention has been described on the basis of some examples. It is to be noted that those skilled in the art will be well aware of many different solutions within the scope of the invention concerned.

The invention provides a mixer oscillator stage which can be used both with the switched 2-band concept and the 3-band concept without changing the architecture of the mixer oscillator stage.

What is claimed is:

1. A mixer oscillator stage, comprising:
    first and second mixers;
    first, second, and third oscillators; and
    a plurality of switches, including a first switch coupled between the first mixer and the first and second oscillators and a second switch coupled between the second mixer and the second and third oscillators,
    wherein the first mixer is adapted to receive radio frequency signals in VHF-Low and VHF-High television bands, and wherein the second mixer is adapted to receive radio frequency signals in the VHF-High and UHF television bands.

2. The mixer oscillator stage of claim 1, wherein the first mixer is operable to be connected in a first configuration to a first tuner for both the VHF-Low and VHF-High television bands, and is operable to be connected in a second configuration to a second tuner for only the VHF-Low television band.

3. A mixer oscillator stage, comprising:

first and second mixers;

first, second, and third oscillators; and a plurality of switches, including a first switch coupled between the first mixer and the first and second oscillators and a second switch coupled between the second mixer and the second and third oscillators, wherein the second mixer is operable to be connected in a first configuration to only a first tuner for the UHF television band, and is operable to be connected in a second configuration to both a second tuner for the VHF-High television band and a third tuner for the UHF television band.

4. A mixer oscillator stage, comprising:

two inputs adapted to receive RF signals;

at least two mixers, each of said mixers being connected to a corresponding one of the inputs;

a plurality of oscillators; and switching means coupled between the at least one mixer and the plurality of oscillators, wherein the mixer oscillator stage is operable to be connected in a first configuration to a first tuner for VHF-Low and VHF-High television bands and a second tuner for the UHF television band, and is operable to be connected in a second configuration to a third tuner for the VHF-Low television band, a fourth tuner for the VHF-High television band, and a fifth tuner for the UHF television band.

5. The mixer oscillator stage of claim 4, wherein the plurality of oscillators comprises three oscillators.

6. The mixer oscillator stage of claim 4, wherein the first mixer is operable in the first configuration to be connected to the first tuner, and is operable in the second configuration to be connected to the third tuner.

7. The mixer oscillator stage of claim 4, wherein the second mixer is operable in the first configuration to be connected to the second tuner, and is operable in the second configuration to be connected to both the fourth tuner and the fifth tuner.

* * * * *